United States Patent
Rahman et al.

(10) Patent No.: US 11,496,342 B1
(45) Date of Patent: Nov. 8, 2022

(54) METHODS AND APPARATUS TO DEMODULATE AN INPUT SIGNAL IN A RECEIVER

(71) Applicant: Texas Instruments Incorporated, Dallas, TX (US)

(72) Inventors: Hasibur Rahman, Wylie, TX (US); Yang Xu, Allen, TX (US); Ariel Dario Moctezuma, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/319,850

(22) Filed: May 13, 2021

(51) Int. Cl.
| | |
|---|---|
| *H04L 27/06* | (2006.01) |
| *H04B 1/16* | (2006.01) |
| *H03K 5/24* | (2006.01) |
| *H03F 3/19* | (2006.01) |
| *H03K 5/00* | (2006.01) |

(52) U.S. Cl.
CPC .............. *H04L 27/06* (2013.01); *H03F 3/19* (2013.01); *H03K 5/24* (2013.01); *H04B 1/16* (2013.01); *H03F 2200/451* (2013.01); *H03K 2005/00078* (2013.01)

(58) Field of Classification Search
CPC .............. H04L 27/06; H04B 1/16; H04B 1/18
See application file for complete search history.

(56) References Cited

U.S. PATENT DOCUMENTS

| | | |
|---|---|---|
| 9,964,593 B1 | 5/2018 | Fortin et al. |
| 2009/0015328 A1* | 1/2009 | Aoki .................. H03F 3/45928 330/252 |
| 2009/0051455 A1* | 2/2009 | Miyashita ............. H03D 3/007 332/103 |
| 2010/0158157 A1 | 6/2010 | Iwata et al. |
| | (Continued) | |

FOREIGN PATENT DOCUMENTS

EP          1981235 A2     10/2018

OTHER PUBLICATIONS

Alegre et al. "A Low-Ripple Fast-Settling CMOS Envelope Detector," 2006 Ph.D. Research in Microelectronics and Electronics, Aug. 31, 2006, 4 pages.

(Continued)

*Primary Examiner* — David S Huang
(74) *Attorney, Agent, or Firm* — Mark A. Valetti; Charles A. Brill; Frank D. Cimino

(57) ABSTRACT

An example apparatus includes: a receiver operable to receive a modulated input signal at a receiver input and output a demodulated signal at a receiver output, the receiver comprising a switch having a first current terminal and a first control terminal, the first current terminal coupled to the receiver output. The example apparatus includes a capacitor having a first terminal and a second terminal, the second terminal coupled to the first control terminal and the first terminal coupled to the receiver input. The example apparatus includes a resistor having a third terminal and a fourth terminal, the fourth terminal coupled to the first control (Continued)

terminal. The example apparatus includes a voltage offset source having an input and an output, the output coupled to the third terminal. The example apparatus includes a current source coupled to the first current terminal.

20 Claims, 4 Drawing Sheets

(56) References Cited

U.S. PATENT DOCUMENTS

2015/0136857 A1\* 5/2015 Pillin .................... G06K 19/07
235/492

OTHER PUBLICATIONS

Low-Power Ask Detector for Low Modulation Indexes and Rail-to-Rail Input Range, IEEE Transactions on Circuits and Systems II: Express Briefs, IEEE, USA, vol. 63, No. 5, 1 May 1, 2016, pp. 458-462, XP011607869, ISS: 1549-7747, DOI: 10.1109/TCSII.2015.2503651.
International Search Report in corresponding PCT Application No. PCT/US2022/029120, dated Sep. 16, 2022 (5 pages).

\* cited by examiner

US 11,496,342 B1

METHODS AND APPARATUS TO DEMODULATE AN INPUT SIGNAL IN A RECEIVER

TECHNICAL FIELD

This description relates generally to receivers, and more particularly to methods and apparatus to demodulate an input signal in a receiver.

BACKGROUND

Amplitude shift keying (ASK) systems are transceivers that modulate an amplitude of a carrier signal with an input binary signal to communicate the binary signal with a receiving device. ASK systems may be implemented in a plurality of applications, such as low-frequency radio frequency (RF) applications, home automation devices, wireless base stations, tire pressure monitoring systems, etc., to send and receive (e.g., communicate) information.

SUMMARY

For methods and apparatus to demodulate an input signal in a receiver, an example apparatus includes a receiver operable to receive a modulated input signal at a receiver input and output a demodulated signal at a receiver output, the receiver comprising a switch having a first current terminal and a first control terminal, the first current terminal coupled to the receiver output. The example receiver includes a capacitor having a first terminal and a second terminal, the second terminal coupled to the first control terminal and the first terminal coupled to the receiver input. The example receiver includes a resistor having a third terminal and a fourth terminal, the fourth terminal coupled to the first control terminal. The example receiver includes a voltage offset source having an input and an output, the output coupled to the third terminal. The example receiver includes a current source coupled to the first current terminal.

BRIEF DESCRIPTION OF THE DRAWINGS

The same reference numbers or other reference designators are used in the drawings to designate the same or similar (functionally and/or structurally) features.

DETAILED DESCRIPTION

Figure 1A:
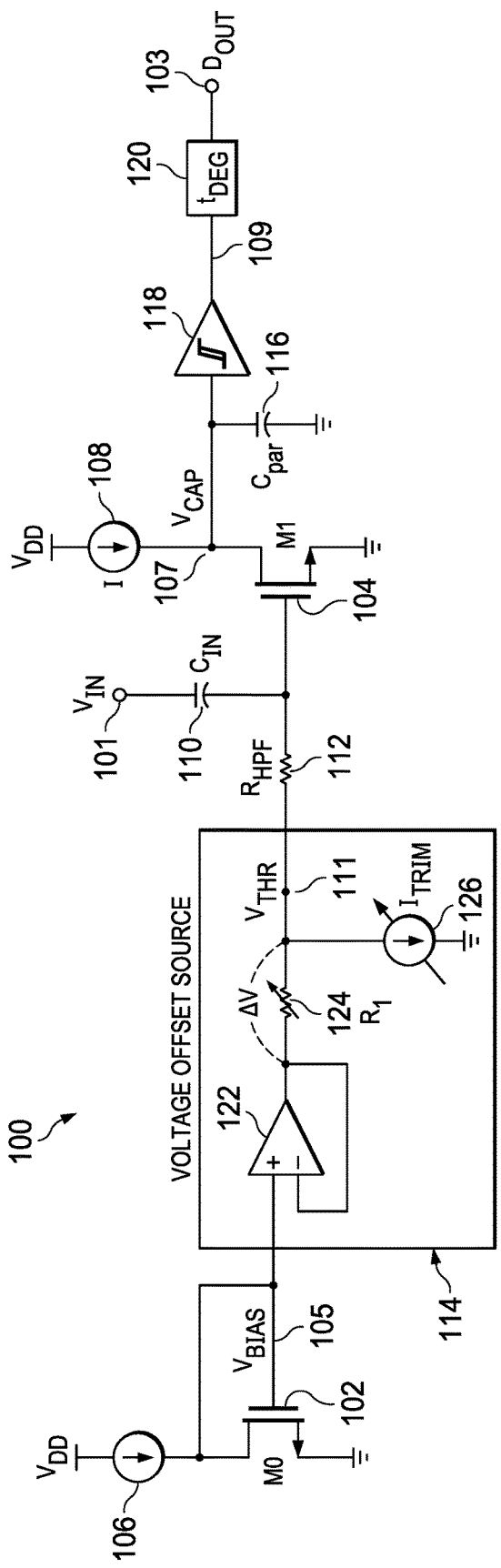
FIG. 1A is a schematic diagram of an example receiver to demodulate an input signal utilizing low power.

In some applications, such as low-frequency RF applications, a receiver included in the ASK system is to receive information without utilizing too much power, because the receiver is always on listening and/or waiting for incoming information. In some examples, the receiver in the ASK system consumes too much power, thus shortening battery life of the low-frequency RF applications (e.g., a mobile phone and/or any portable device) and/or violating low power application requirements and power budgets.

In some examples, an operational amplifier (op-amp), full-wave rectifier based envelope detector is implemented by ASK systems to demodulate an incoming carrier signal. However, such an envelope detector realizes full-wave rectification in a current domain, which requires a high bandwidth power-consuming transconductor to convert input voltage into different currents. For example, a sine wave input of 400 millivolts (mV) has a peak current of at least 40 microamps (µA), so the base current of the input transconductor has to be at least greater than 40 µA. In this example, the total DC current of the ASK system is around 100 µA, where the majority of the current is drawn by the transconductor. Such an amount of current consumed by the ASK system may exceed a power budget of the application. In some examples, the operational amplifier full-wave rectifier based envelope detector takes up a large amount of silicon area.

Examples disclosed herein include an ASK receiver having a matched current mirror with a programmable gate-to-source voltage (Vgs) offset and an AC signal injection capacitor to minimize total quiescent current (Iq) but maintain speed and receiver sensitivity. Advantageously, the ASK receiver disclosed herein is two times smaller in silicon area than the ASK receiver implementing the operational amplifier full-wave rectifier based envelope detector.

In examples disclosed herein, the ASK receiver is configured to include a common source amplifier that obtains the input signal, $V_{IN}$, and outputs a demodulated signal, $D_{OUT}$. The common source amplifier includes a transistor that is loaded with a small amount of current (e.g., 0.5 µA) to save power consumption. The transistor is coupled to a matched transistor to make up the matched current mirror. The transistor obtains, at a transistor gate and/or transistor base, the input signal and a threshold, the threshold to ensure that the input signal is not demodulated unless it satisfies the threshold. The threshold is set utilizing the programmable Vgs offset source, a decoupling resistor coupled to the gate and/or base of the transistor, and the matched transistor. For example, the matched transistor enables the transistor of the common source amplifier to trigger (e.g., output the input signal) at a gate voltage of zero volts. The programmable Vgs offset source adds a DC offset to the trigger point of the transistor, which sets the threshold for the common source amplifier. In examples disclosed herein, the threshold is variable (e.g., programmable) and can change based on manufacturer and/or user requests. A threshold may be chosen and/or changed based on the application of the ASK receiver. For example, applications having low loss (e.g., a transmission line that is lossy) may require a different threshold than an application that is not lossy; process corners of an application can dictate a threshold; an application where the receiver is coupled to a different transmitter manufactured by a different manufacturer may require a different threshold than an application where the receiver is coupled to a transmitter designed by the same manufacturer; etc. Therefore, the ASK receiver disclosed herein enables a flexibility of applications.

FIG. 1A is a schematic diagram of an example receiver 100 to demodulate an input signal 101 utilizing low power. The example receiver 100 includes an example first switch (M0) 102, an example second switch (M1) 104, an example first current source 106, an example second current source 108, an example first capacitor ($C_{IN}$) 110, an example first resistor ($R_{HPF}$) 112, an example threshold voltage offset source 114, an example second capacitor 116, an example comparator 118, and an example delay generator 120. The example voltage offset source 114 includes an example amplifier 122, an example second resistor ($R_1$) 124, and an example third current source ($I_{TRIM}$) 126.

The first switch (M0) 102 and the second switch (M1) 104 are implemented by N-channel metal-oxide-semiconductor field-effect transistors (nMOSFETs) (e.g., N-channel silicon MOSFETs, N-channel gallium nitride (GaN) MOSFETs, etc.). Alternatively, the first switch (M0) 102 and the second switch (M1) 104 may be implemented by a different type of transistor, such a NPN bipolar junction transistors (BJTs), PNP BJT, a junction gate field-effect transistor (JFET), a P-channel metal-oxide-semiconductor field-effect transistors (pMOSFETs), etc.

In FIG. 1A, the first switch (M0) 102 includes a drain (e.g., a drain terminal, a current terminal, etc.), a source (e.g., a source terminal, a current terminal, etc.) and a gate (e.g., a gate terminal, a control terminal, etc.). The second switch (M1) 104 includes a drain (e.g., a drain terminal, a current terminal, etc.), a source (e.g., a source terminal, a current terminal, etc.) and a gate (e.g., a gate terminal, a control terminal, etc.).

The first switch (M0) 102 and the second switch (M1) 104 are matched switches. For example, a gate-to-source voltage (Vgs) of the first switch (M0) 102 is matched to a gate-to-source voltage (Vgs) of the second switch (M1) 104. Matched switches indicate that both switches (e.g., M0 and M1) are fabricated to be as close to identical as possible (based on the variability of semiconductor process), and, as such, will react to temperature, change in input voltage, change in load current, etc., in a similar and/or identical manner. For example, the Vgs of M0 and M1 may change (e.g., increase, decrease, etc.) in a similar manner during any change of circuit conditions. Matched devices, such as M0 and M1, have identical or similar geometries and are biased with identical current densities. For example, M1 may be composed of two unit transistors each carrying one unit of current while M0 may be composed of one unit transistor carrying one unit of current. In this example, the ratio of the area of M1 104 to the area of M0 102 is equal to two, and the ratio of current of M1 104 to M0 102 is equal to two, but current density of M1 104 is equal to the current density of M2 102.

In FIG. 1A, the drain of the first switch 102 is coupled to an output of the first current source 106, the gate of the first switch 102 is coupled to the drain of the first switch 102 and to the output of the first current source 106, and the source of the first switch 102 is coupled to a common potential (e.g. ground). The first current source 106 sources low current from a supply voltage (Vdd). In some examples, the first current source 106 may source any amount of current from the supply voltage, based on the application of the receiver 100.

In FIG. 1A, the drain of the second switch 104 is coupled to an output of the second current source 108, the gate of the second switch 104 is coupled to the first capacitor ($C_{IN}$) 110 and a first resistor terminal of the first resistor ($R_{HPF}$) 112, and the source of the second switch 104 is coupled to a common potential (e.g. ground). In this example, the first switch 102 and the second switch 104 comprise a current mirror, and the second current source 108 is the load of the current mirror. The first current source 106 is a reference current. In some examples, the output of the first current source 106 causes the second switch 104 to trigger at an equal drain current (if the size ratio of transistor M0 is the same as the size ratio of M1) and, thus, causes a voltage at the drain of the second switch 104 ($V_{CAP}$ 107) to be equal to the voltage at the drain of the first switch 102 ($V_{BIAS}$ 105). In this example, the trigger point of the second switch 104 is zero volts, such that when the gate of the second switch 104 is zero volts, $V_{BIAS}$ 105 and $V_{CAP}$ 107 are equal.

The first capacitor 110 and the first resistor 112 comprise a high pass filter (HPF). The high pass filter (e.g., the first capacitor 110 and the first resistor 112) enables the input signal 101 to pass through the receiver 100 when the input signal 101 is above a cut-off frequency point, where the cut-off frequency point is set (e.g., determined) based on the values of the first capacitor 110 and the first resistor 112 (e.g., the capacitance and the resistance). For example, the reactance of the first capacitor 110 is high at low frequencies, such that the first capacitor 110 acts like an open circuit and mitigates transmission of low frequencies from the input signal 101 to the gate of the second switch (M1) 104 until the cut-off frequency point is reached. Above the cut-off frequency point, the reactance of the first capacitor 110 is reduced, such that the first capacitor 110 acts similar to a short circuit, allowing the input signal 101 to pass through and into the receiver 100 for demodulation.

In FIG. 1A, an input of the voltage offset source 114 is coupled to the gate of the first switch 102 and an output of the voltage offset source 114 is coupled to a second resistor terminal of the first resistor ($R_{HPF}$) 112. In this example, the input of the voltage offset source 114 is a non-inverting input of the amplifier 122. An inverting input of the amplifier 122 is coupled to an output of the amplifier 122, such that the amplifier 122 implements negative feedback. The output of the amplifier 122 is coupled to a first resistor terminal of the second resistor ($R_1$) 124. In this example, the output of the voltage offset source 114 is a second resistor terminal of the second resistor 124, and the second resistor terminal of the second resistor 124 is coupled to the second resistor terminal of the first resistor ($R_{HPF}$) 112. The third current source ($I_{TRIM}$) 126 includes an input that is coupled to the second resistor terminal of the second resistor ($R_1$) 124 and the second resistor terminal of the first resistor ($R_{HPF}$) 112. In some examples, the third current source ($I_{TRIM}$) 126 is a trimming threshold current reference to calibrate for process errors of the second resistor ($R_1$) 124 and comprises a transistor configuration. The second resistor ($R_1$) 124 is a programmable threshold resistor and is used to set the offset voltage. In this example, the voltage offset source 114 offsets the trigger point of the second switch 104 from zero volts. For example, the voltage offset source 114 provides an offset voltage ($\Delta V$), which determines the threshold voltage ($V_{THR}$) 111 that enables the second switch 104 to turn on (e.g., trigger) when the input signal 101 magnitude is larger than the offset voltage ($\Delta V$), as long as the frequency of the input signal 101 is above the frequency cut-off point. In this example, the offset voltage ($\Delta V$) is a voltage drop across the second resistor ($R_1$) 124.

In FIG. 1A, an input (e.g., input terminal) of the comparator 118 is coupled to the drain of the second switch 104. The second capacitor 116 is coupled to the input of the comparator 118. In some examples, the comparator 118 is implemented by a Schmitt Trigger. In other examples, the comparator 118 may be implemented by any other type of comparator and/or circuitry that converts an analog input signal to a digital output signal. The example second capacitor 116 illustrates parasitic capacitance at the input of the comparator 118. In this example, the second capacitor 116 includes a small amount of capacitance relative to a receiver implementing the envelope detector. The small second capacitor 116 enables $V_{CAP}$ 107 to change from high to low at a relatively fast rate (e.g., instantaneously) to ensure little pulse width distortion at the output of the comparator 118.

An output of the comparator 118 is coupled to an input of the delay generator 120. The delay generator 120 includes a digital output 103 representative of the demodulated input signal 101. In some examples, the digital output 103 is a string of binary values (1s and 0s), indicative of information that was modulated (e.g., mixed) with a sine wave to generate the input signal 101. In this example, the delay generator 120 is implemented by a pulse deglitcher to filter out narrow pulses (e.g., narrow positive pulses and/or narrow negative pulses) at a first comparator output 109 of the comparator 118. Additionally and/or alternatively, the delay generator 120 may be implemented by any other circuitry to filter the output 109 of the comparator 118. In this example, the delay generator 120 filters out and/or absorbs unwanted noise unintentionally passing through the comparator 118.

In an example operation of the receiver 100 of FIG. 1A, the input signal 101 is provided to the gate of the second switch 104 via the first capacitor (CO 110. In some examples, the input signal 101 is an ASK modulated signal (e.g., a sine wave that is amplitude modulated based on the data it is carrying). In some examples, the input signal 101 is provided by (e.g., sent from) a transmitter to communicate data. The second switch 104 turns on (e.g., initiates) responsive to a magnitude the input signal 101 satisfying the threshold voltage of the second switch 104 (e.g., when a peak swing of the input signal 101 is greater than or equal to the threshold voltage, Vth, of M1). A current conducting through the second switch 104 is greater than the current of the second current source 108. In this example, the current provided by the second current source 108 is also referred to herein as the pull-up current. The voltage $V_{CAP}$ 107 goes low (e.g., is pulled down) responsive to the second switch 104 turning on (e.g., an initiation of the second switch 104).

During operation, the second switch 104 turns off (e.g., deactivates) responsive to the magnitude of the input signal 101 falling below the threshold voltage of the second switch 104. The current stops conducting through the second switch 104 responsive to deactivation of the second switch 104 and the pull-up current pulls the voltage $V_{CAP}$ 107 up to the supply voltage, such that $V_{CAP}$ 107 goes high responsive to the second switch 104 turning off. The high and low values of $V_{CAP}$ 107 represent the sign waveform in the input signal 101.

In this example, the output 109 of the comparator 118 is high when the input signal 101 does not include a sine waveform having a threshold magnitude (e.g., when the peak swing of the input signal 101 does not satisfy the threshold of the second switch 104) and the output 109 of the comparator 118 is low when the input signal 101 includes a sine waveform having a threshold magnitude (e.g., when the peak swing of the input signal 101 satisfies the threshold of the second switch 104). In this manner, the receiver 100 distinguishes whether there is a presence of a sine waveform on the input signal 101 by outputting a low pulse.

In the example operation, the threshold voltage of the second switch 104 is determined by the voltage offset source 114. For example, the voltage offset source 114 generates the offset voltage ($\Delta V$) to provide a threshold voltage ($V_{THR}$) 111 to set a trigger point for the second switch 104. In some examples, the offset voltage ($\Delta V$) is set large enough to be greater than noise at the input signal 101 but low enough that the signals can pass through. To generate the offset voltage ($\Delta V$), the example amplifier 122 buffers the voltage from the gate of the first switch 102 to the output of the amplifier 122. The second resistor ($R_1$) 124 drops a voltage responsive to the output of the amplifier 122 and creates offset voltage $\Delta V$, which can be trimmed and programmed by the third current source 126 to generate the desired offset voltage ($\Delta V$) and, thus, a desired threshold voltage ($V_{THR}$) 111. As used herein, trimming a voltage is defined as adjusting the voltage by a small amount. In some examples, the third current source 126 includes fixed resistors and transistors that are utilized to inject a current (e.g., a voltage source with a high output impedance) into the output of the second resistor 124.

During the example operation, when the peak swing of input signal 101 is less than the offset voltage ($\Delta V$) (e.g., $V_{IN,0-pk} < \Delta V$), the pull down current through the second switch 104 is less than the pull up current of the second current source 108, and $V_{CAP}$ 107 is high (e.g., the voltage of $V_{CAP}$ 107 is close to the value of supply voltage $V_{DD}$). In some examples, the peak swing of the input signal 101 is less than the offset voltage ($\Delta V$) when no sine waveform having a threshold magnitude is present in the input signal 101. The comparator 118 outputs a one (e.g., a logic high) at the first comparator output 109 responsive to the high voltage at $V_{CAP}$ 107. The delay generator 120 generates a delay at the output 103 responsive to the one (e.g., high voltage) at the first comparator output 109. In some examples, the delay generator 120 initializes pulse deglitchers that receive the high voltage and wait a period of time before outputting the same.

During the example operation, when the peak swing of the input signal 101 is greater than the offset voltage ($\Delta V$) (e.g., $V_{IN,0-pk} > \Delta V$), the pull down current through the second switch 104 pulls the voltage $V_{CAP}$ 107 low (e.g., to zero volts), resulting in a one-to-zero transition. In some examples, the input signal 101 is greater than the offset voltage ($\Delta V$) when a sine waveform having a threshold magnitude and/or peak swing is present in the input signal 101. In some examples, the one-to-zero transition may include a delay (e.g., a transition delay) due to the amount of pull down current conducting through the second switch 104. In this example, the high-to-low transition (one-to-zero transition) is short relative to receiver transition times (e.g., transition times from the receiver implementing the envelope detector). The comparator 118 outputs a low voltage at the first comparator output 109 responsive to the low voltage of $V_{CAP}$ 107. The delay generator 120 generates a delay at the output 103 responsive to the zero (e.g., low voltage) at the first comparator output 109. In some examples, the delay generator 120 initializes pulse deglitchers to implement the delay of the falling edge (e.g., the output of a low pulse) at the output 103.

When the input signal 101 no longer includes the sine waveform, the second switch 104 turns off and the pull up current pulls the voltage $V_{CAP}$ 107 high to the supply voltage $V_{DD}$ which results in a zero-to-one transition. In some examples, the zero-to-one transition may include a delay (e.g., a transition delay) due to parasitic capacitance of the second capacitor 116 and the amount of pull up current. However, this delay is minimal relative to a transition delay at the output of the receiver implementing an envelope detector.

In some examples, the receiver 100 is inactive when a sine wave (e.g., a carrier wave) is not provided in an input signal 101. In such an example, the receiver 100 outputs a constant high voltage at the output 103. For example, the gate-to-source voltage of the second switch 104 is less than a threshold (e.g., offset voltage $\Delta V$), and M1 is off. When M1 is off, $V_{CAP}$ is maintained high by a small amount of pull-up current from current source 108. The current source 108 stops sourcing current from the supply voltage ($V_{DD}$) when $V_{CAP}$ is equivalent to $V_{DD}$. In this example, the current sourced by the second current source 108 (e.g., the pull up current) is low (e.g., less than 0.5 μA, equivalent to zero amperes, etc.) because $V_{CAP}$ is equivalent to $V_{DD}$. Therefore, when the receiver 100 is inactive, the total DC current consumed by the receiver is very low relative to the total DC current consumed by an inactive receiver implementing the envelope detector. In this example, the total DC current consumed by the inactive receiver 100 (e.g., the quiescent current) is approximately 3.5 μA. However, the quiescent current of the receiver 100 may be any other small value of current based on a size of the amplifier 122, the first current source 106, and the third current source ($I_{TRIM}$) 126. The example comparator 118 and the example delay generator 120 do not consume current when the receiver 100 is inactive.

Advantageously, the receiver 100 maintains a high speed of resolution (e.g., resolves zeros and ones in the input signal 101 at a quick rate) and a high sensitivity relative to a receiver implementing the envelope detector. In some examples, a sensitivity of the receiver 100 is an important factor to consider during design, because the sensitivity determines the minimum swing of the input signal 101 that causes allowable pulse width distortion at the output 103. In some examples, the voltage offset source 114 adjusts the offset voltage to enable high sensitivity in the receiver 100. The offset voltage can be adjusted based on application of the receiver 100 and, thus, results in a simple way to ensure the receiver 100 is sensitive to certain magnitudes (e.g., signal swings) at the input signal 101. The capacitance of the first capacitor (ON) 110 and the resistance of the first resistor ($R_{HPF}$) 112 can be adjusted based on application of the receiver 100 and, thus, results in a simple way to ensure the receiver 100 is sensitive to certain frequencies.

The receiver 100 maintains a high speed of resolution based on defining a low pulse width distortion. Pulse width distortion is a difference between high-to-low transition time and low-to-high transition time at the first comparator output 109. In some examples, the high-to-low transition can be small (e.g., short) if the swing of the input signal 101 is sufficiently large, depending on the pull down current through the second switch (M1) 104. In some examples, the low-to-high transition can be defined by the pull up current and the total parasitic capacitance of the second capacitor 116 when the input signal 101 no longer includes a sine waveform. In some examples, the low-to-high transition can be small (e.g., short) when the parasitic capacitance is minimal and/or when the bias current of the second current source 108 is larger. Therefore, the speed of the receiver 100 can be determined by configuring the receiver 100 to include low parasitic capacitance and an optimal pull up current. In this example, the pull up current is 0.5 μA and the parasitic capacitance of the second capacitor 116 is 10 femtofarads.

Advantageously, the receiver 100 is simple in design and uses two times less die area than the receiver implementing an envelope detector. Such a receiver implementing an envelope detector is described in further detail below in connection with FIG. 4.

Figure 1B:
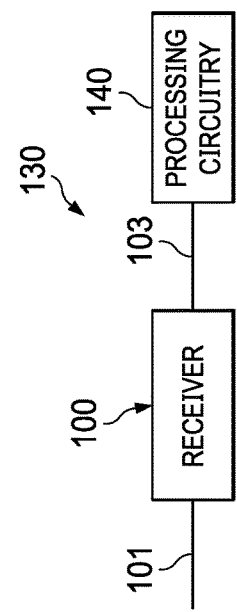
FIG. 1B is a system including the example receiver of FIG. 1A to demodulate an input signal.

FIG. 1B is a system 130 including the example receiver 100 of FIG. 1A to demodulate the input signal 101. The example system 130 includes the example receiver 100 and example processor circuitry 140. In this example, the output 103 of the receiver 100 is coupled to an input of the processor circuitry 140.

In FIG. 1B, the receiver 100 extracts data from the input signal 101 as described above in connection with FIG. 1A. In some examples, the input signal 101 is an amplitude modulated signal and, thus, the receiver 100 extracts a digital signal and/or digital data from the amplitude modulated signal. The example receiver 100 extracts the data from the input signal 101 utilizing a bias current that meets a power budget of the system 130. For example, the system 130 may budget for the receiver 100 to consume a certain amount of power when inactive. Such a budget may be determined based on battery life of the application of the receiver 100.

In FIG. 1B, the example processor circuitry 140 is circuitry that incorporates components of an electronic system. The example processor circuitry 140 may be implemented by and/or comprise a combination of one or more programmable processors, hardware logic, and/or hardware peripherals and/or interfaces. Additionally or alternatively, the example processor circuitry 140 may include memory, input/output (I/O) port(s), and/or secondary storage. In some examples, the receiver output 103 is coupled to memory of the processor circuitry 140, such that the data extracted by the receiver 100 is stored in memory. Additionally and/or alternatively, the receiver output 103 is coupled to a memory controller of the processor circuitry 140, such that the extracted data is stored in memory and/or provided to processors (e.g., CPUs, GPUs, FPGAs, etc.) for processing.

In FIG. 1B, the example receiver 100 advantageously improves the operation of the example processor circuitry 140. For example, the receiver 100 outputs data with minimal pulse width distortion of the input signal 101, which not only improves communication between a transmitting device and the system 130, but also improves the accuracy of the processor circuitry 140. In some examples, a threshold amount of pulse width distortion can cause a receiver to represent data in the input signal incorrectly. For example, when an input signal is modulated with a binary string of {0 1 1 0 1 0}, the output of a receiver should be {0 1 1 0 1 0}. However, some receivers, such as envelope detector based receivers, have too much capacitance at the output and, thus, may output a distorted signal, such as {0 1 1 0 1 1} if the pulse width distortion is 1 bit.

Figure 2:
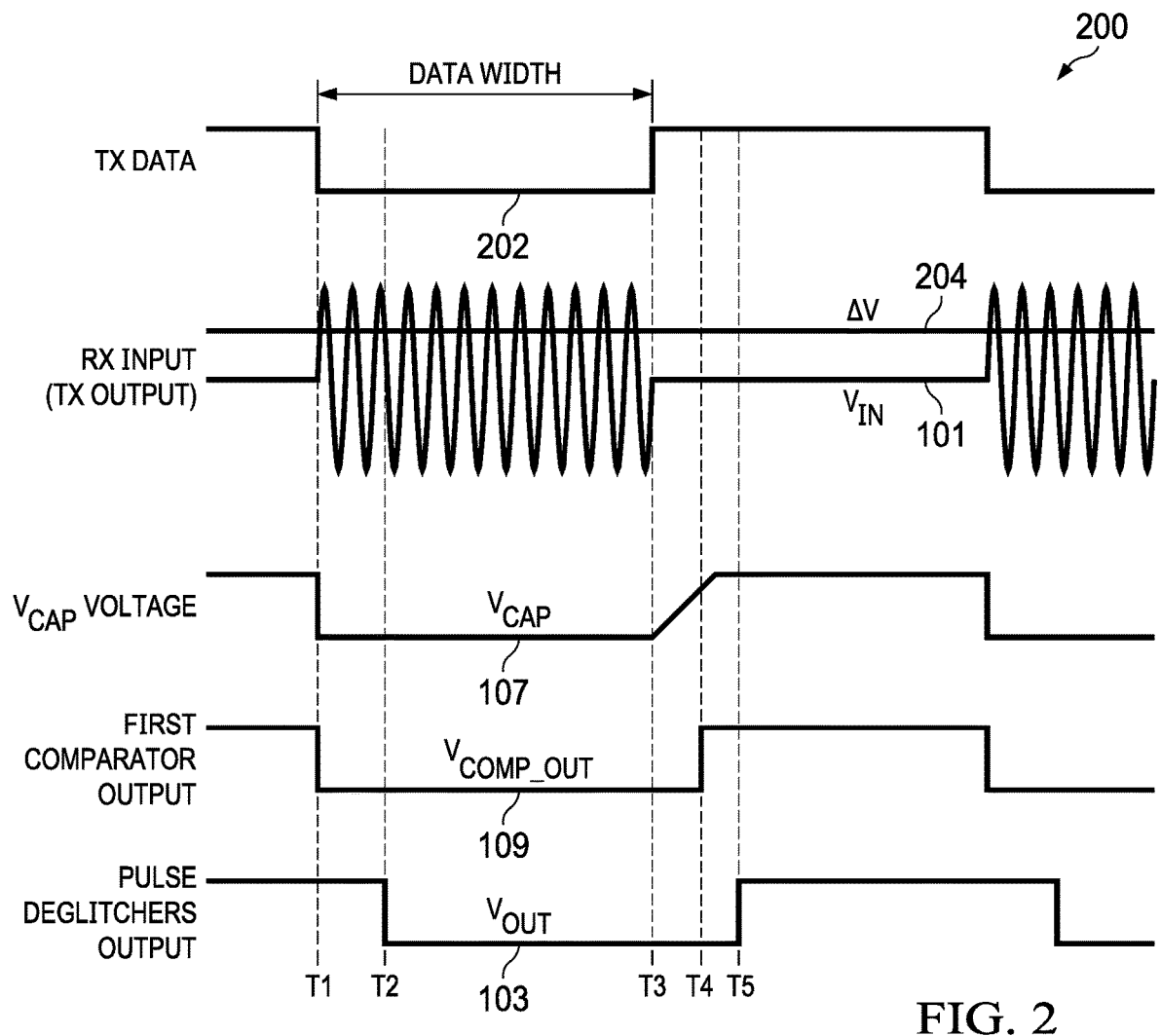
FIG. 2 is a first timing diagram illustrating the signals through the example receiver of FIG. 1A during an operation.

FIG. 2 is a first timing diagram 200 illustrating the signals through the receiver 100 of FIG. 1A during operation. In FIG. 2, the example first timing diagram 200 includes a transmit data signal 202, the input signal 101, an offset voltage signal ($\Delta V$) 204, the capacitor voltage signal ($V_{CAP}$) 107, the first comparator output signal 109, and the output signal 103.

In this example, the transmit data signal 202 is data representative of ones and zeros. The transmit data signal 202 is to be communicated to the receiver 100 by modulating a sine waveform with the transmit data signal 202. The modulated sine waveform is represented by the input signal 101, which may be an ASK modulated signal. In this example, the sine waveform in the input signal 101 represents zeros in the transmit data signal 202 and no sine waveform in the input signal 101 represents ones in the transmit data signal 202. The example receiver 100 is to distinguish between the zeros and ones in the input signal 101.

At a first time (T1) in the first timing diagram 200, the transmit data signal 202 has a falling edge, indicative of a zero, and the input signal 101 illustrates a sine waveform. At the first time, the input signal 101 crosses the offset voltage signal ($\Delta V$) 204 and, thus, turns on the second switch 104. The second switch 104 pulls the capacitor voltage signal ($V_{CAP}$) 107 low, which causes the first comparator output signal 109 to go low at the first time (T1). When the first comparator output signal 109 goes low, the sine waveform on the input signal 101 is resolved.

At a second time (T2) in the first timing diagram 200, the delay generator 120 outputs a falling edge at the output 103 responsive to a period of time from the falling edge of the first comparator output 109. For example, the delay generator 120 generates a delay responsive to the falling edge at the first comparator output 109.

At a third time (T3), the transmit data signal 202 has a rising edge, indicative of a one, and the input signal 101 illustrates a flat line. At the third time (T3), the input signal 101 falls below the offset voltage signal ($\Delta V$) 204 and, thus, turns off the second switch 104. The second switch 104 stops pulling the capacitor voltage signal ($V_{CAP}$) 107 low, which causes the first comparator output signal 109 to ramp up at the third time (T5). For example, the second capacitor 116 charges as the current conducting through the second switch 104 reduces, thus causing the capacitor voltage signal ($V_{CAP}$) 107 to ramp up as the second current source 108 becomes greater in magnitude compared to the current pulled by the second switch (M1) 104.

At a fourth time (T4), the capacitor voltage signal ($V_{CAP}$) 107 ramps high enough to cause the comparator 118 to output a high pulse at the first comparator output 109. The difference between the third time (T3) and the fourth time (T4) is indicative of low-to-high transition and affects the pulse width distortion.

At a fifth time (T5), the delay generator 120 outputs a rising edge at the output 103 responsive to a period of time from the rising edge (e.g., the high pulse) of the first comparator output 109. For example, the delay generator 120 generates a delay responsive to the rising edge at the first comparator output 109. The delay generator 120 may be skewed to reduce a rise/fall delay mismatch. For example, the falling delay of the delay generator 120 (e.g., pulse deglitcher) output may be set to be approximately equal to the rising delay plus the delay associated with a rising $V_{CAP}$. Setting the falling delay to be approximately equal to the rising delay plus the delay associated with the rising voltage $V_{CAP}$ reduces nominal pulse width distortion in most operating conditions.

Figure 3:
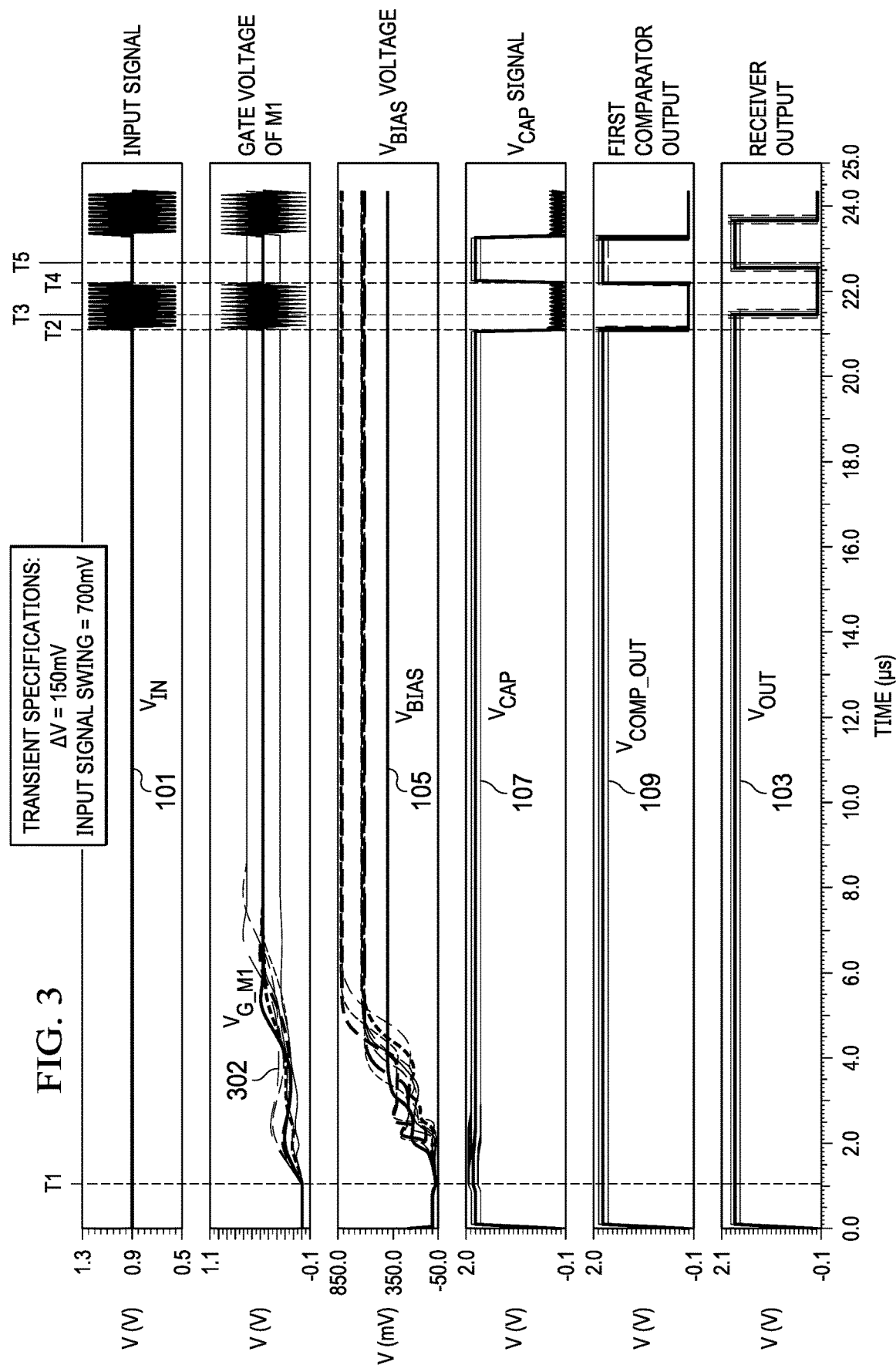
FIG. 3 is a second timing diagram illustrating the signals through the example receiver over various process corners during operation.

FIG. 3 is a second timing diagram 300 illustrating a response of the receiver 100 over various process corners, a sensitivity of 700 mV, and an offset voltage ($\Delta V$) equal to 150 mV. In FIG. 3, the second timing diagram 300 includes the input signal 101, a gate voltage of the second switch ($V_{G\_M1}$) 104, the bias voltage ($V_{BIAS}$) 105, the capacitor voltage signal ($V_{CAP}$) 107, the first comparator output signal ($V_{COMP\_OUT}$) 109, and the output signal 103. In FIG. 3, there are multiple input signal lines, multiple gate voltage lines, multiple bias voltage lines, multiple capacitor voltage signal lines, multiple comparator output voltage lines, and multiple output voltage lines, where one line (for each signal 101, 302, 105, 107, 109, and 103) is indicative of the ideal/nominal process conditions and the other lines represent process variations (such as "process corners"). As used herein, a process corner is an example of a design-of-experiments technique that looks at device performance based on device fabrication process deviations where each "corner" represents an extreme deviation in one or more process conditions. Process corners represent the extremes of these parameter variations within which a circuit (e.g., receiver 100) that has been formed on/over a semiconductor wafer must function correctly. A circuit (e.g., the receiver 100) running on devices fabricated at these process corners may run slower or faster than specified and at lower or higher temperatures and voltages.

At a first time (T1) in the second timing diagram 300, the receiver 100 becomes active. For example, supply voltage is provided to the components in the receiver circuitry illustrated in FIG. 1A, such that the gate voltage 302 of the second switch 104 begins to transition on, the bias voltage 105 begins to settle at a specified bias voltage determined by the first switch 102 and the first current source 106, the capacitor voltage 107 is high, the comparator output voltage 109 is high, and the receiver output 103 is high.

At a second time (T2) in the second timing diagram 300, the input signal 101 inputs a sine waveform having a swing of at least 700 mV. At the second time (T2), the gate voltage of the second switch 104 satisfies the threshold voltage of the second switch 104 and, thus, turns the second switch 104 on. At the second time (T2), the capacitor voltage 107 goes low responsive to the second switch 104 turning on. At the second time (T2), the comparator output voltage 109 goes low responsive to the capacitor voltage 107 going low.

At a third time (T3) in the second timing diagram 300, the delay generator 120 outputs a low voltage at the output 103 responsive to a duration of time ending after the second time (T2). For example, pulse deglitchers absorb noise and narrow pulses output by the output comparator 118 during the high-to-low transition of the comparator output 109 for a period of time. When the period of time is up (e.g., at time T3), the output 103 goes low.

At a fourth time (T4) in the second timing diagram 300, the input signal 101 goes flat (e.g., no sine waveform is present in the input signal 101) and the gate voltage 302 of the second switch 104 goes low. The gate voltage 302 falls below the bias voltage 105, thus turning off the second switch 104. The capacitor voltage 107 goes high responsive to the second switch 104 turning off at the fourth time (T4). When the capacitor voltage 107 goes high, the comparator 118 outputs a high signal at the first comparator output 109.

At a fifth time (T5) in the second timing diagram 300, the delay generator 120 outputs a high voltage at the output 103 responsive to a duration of time ending after the fourth time (T4). For example, pulse deglitchers absorb noise and narrow pulses output by the output comparator 118 during the low-to-high transition of the comparator output 109 for a period of time. When the period of time is up (e.g., at time T5), the output 103 goes high.

The example second timing diagram 300 illustrates that the receiver 100 can resolve ones and zeros in the input signal 101 no matter the variation in fabrication, temperature, and/or voltage.

Figure 4:
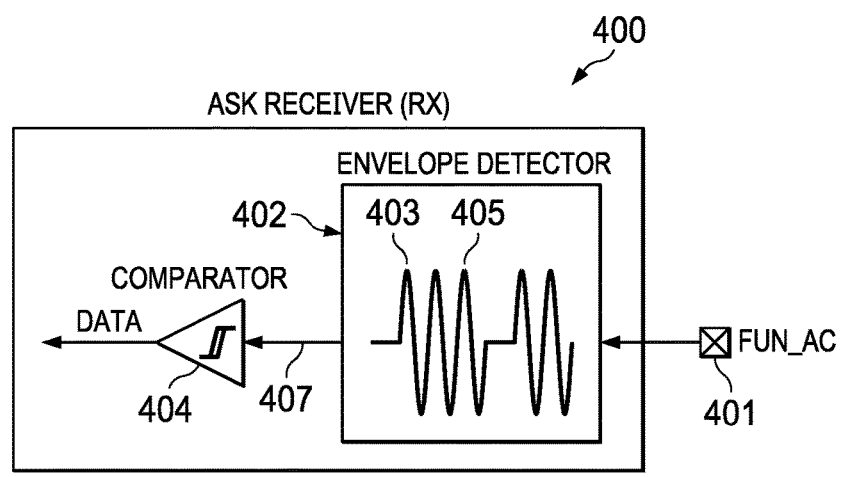
FIG. 4 is a block diagram of an example envelope detector based receiver to demodulate an input signal utilizing an envelope detector.

FIG. 4 is a block diagram of an example envelope detector based receiver 400 to demodulate an input signal 401 utilizing an envelope detector 402. The example envelope detector based receiver 400 includes the example envelope detector 402 and an example second comparator 404. In FIG. 4, an input of the envelope detector 402 obtains an AC input signal 401 and an output of the envelope detector 402 is coupled to an input of the second comparator 404.

In FIG. 4, the envelope detector 402 extracts the ASK modulated input signal from the AC input signal 401. For example, the envelope detector 402 follows peaks in the AC input signal 401 and outputs them as a demodulated pulse signal 407. For example, the envelope detector 402 follows peaks 403 and 405 and outputs a demodulated pulse signal 407 representative of those peaks. The envelope detector 402 utilizes well known circuitry to follow the peaks and output a demodulated pulse signal 407.

The second comparator 404 obtains the demodulated pulse signal 407 and compares it to a threshold pulse signal (e.g., a threshold voltage) to determine a data output. The threshold is set to ensure that the peak of the AC input signal 401 is not just noise. For example, the envelope detector 402 detects a peak that is noise and not data, and the second comparator 404 does not output an indication of that peak because the demodulated pulse signal 407 does not satisfy the threshold voltage.

One of the disadvantages of the envelope detector based receiver 400 is that it draws more current when inactive (e.g., when there is no pulse on the AC input signal 401 and/or when there is no peak on the AC input signal 401) relative to the receiver 100 of FIG. 1A when the receiver 100 of FIG. 1A is inactive. A second disadvantage of the envelope detector based receiver 400 is that it is slower to respond to peaks in the AC signal 401 relative to the receiver 100 of FIG. 1A. Examples of such disadvantages are described in further detail below in connection with FIG. 5.

Figure 5:
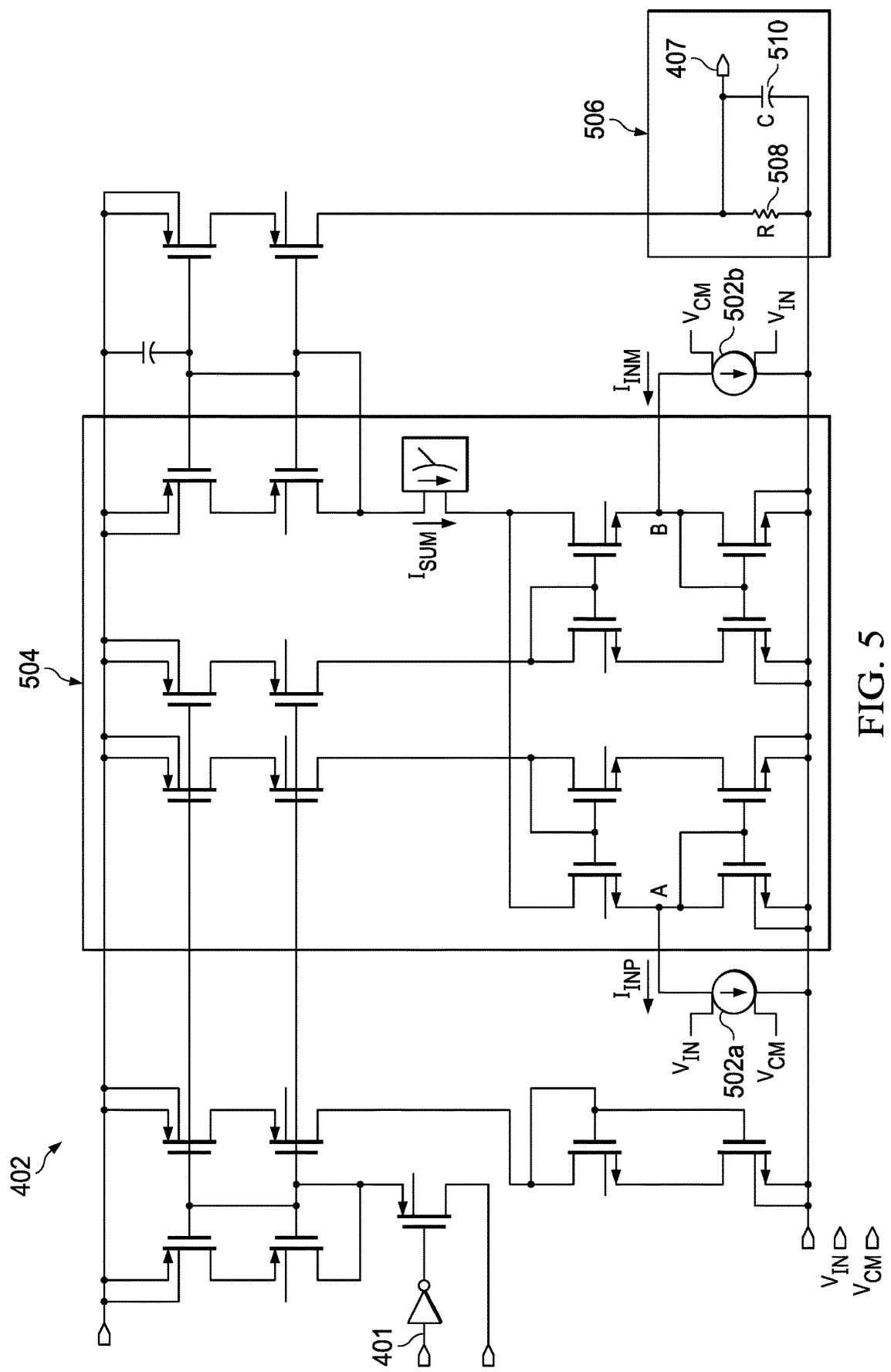
FIG. 5 is a schematic diagram of the example envelope detector of FIG. 4 to extract data from an input signal.

FIG. 5 is a schematic diagram of the example envelope detector 402 of FIG. 4. The envelope detector 402 of FIG. 5 includes an example transconductor 502, an example full-wave rectifier 504, and an example RC filter 506. The transconductor 502 is implemented by a first transconductor 502a and a second transconductor 502b. The example RC filter 506 includes an example third resistor 508 and an example third capacitor 510.

The transconductor 502 is coupled to the full-wave rectifier 504. The first transconductor 502a is coupled to the full-wave rectifier 504 at a node A and the second transconductor 502b is coupled to the full-wave rectifier 504 at a node B. In this example, the transconductor 502 uses a differential source degenerated common-source amplifier topology, and there are two input branches. The first input branch is connected to AC input signal 401 and the second input branch is connected to a common-mode voltage. The AC input signal 401 has an AC and DC component. The DC component is referred to as the common-mode voltage. In other examples, the transconductor 502 may comprise of any circuitry to convert input voltage into output current. The full-wave rectifier 504 includes a configuration of transistors to rectify the input current from the transconductor 502.

In an operation of the envelope detector 402, the AC input signal 401 is converted from a voltage to a current via the transconductor 502. The current generated by the first transconductor 502a is a positive current ($I_{INP}$) and the current generated by the first transconductor 502b is a negative current ($I_{INM}$). The positive current ($I_{INP}$) is injected into node A of the full-wave rectifier 504 and the negative current ($I_{INM}$) is injected into node B of the full-wave rectifier 504. The sum of the current at node A and the current at node B is $I_{SUM}$. $I_{SUM}$ is rectified by the full-wave rectifier 504 and mirrored into the RC filter 506. The RC filter 506 generates an output voltage (e.g., the demodulated pulse signal 407) responsive to the mirroring of $I_{SUM}$. The output voltage of the RC filter 506 is smooth relative to a full-wave signal rectified by the full-wave rectifier 504.

The transconductor 502 is a linear transconductor and consumes an amount of current that is proportional to peak voltage in the AC input signal 401. A peak current of the AC input signal 401 can be determined by utilizing equation (1) below. In equation (1), ΔIpeak is a change in peak current of the AC input signal 401, $g_m$ is the transconductance of the transconductor 502, and ΔVpeak the change peak voltage of the AC input signal 401.

$$\Delta I_{peak} = g_m \times \Delta V_{peak} \tag{1}$$

Therefore, if the AC input signal 401 has an amplitude of 400 mV, the transconductance of the transconductor 502 is 500, for example, then the change in peak current ΔIpeak may be equivalent to 20 μA. To ensure that an input transistor, included in the differential source degenerated common-source amplifier topology of the transconductor 502, operates in saturation region, the bias current of the transconductor 502 has to be larger than 20 μA. And since there are two input transistors (e.g., one for the AC input signal 401 and one for the common mode voltage), the total bias current of the transconductor 502 has to be greater than 40 μA. The bias current of the transconductor 502 in combination with the current consumed by the other of components of the envelope detector 402 and the second comparator 404 of FIG. 4 may exceed a current budget and/or power budget of the envelope detector based receiver 400. The example receiver 100 of FIG. 1A is biased with less current than the current needed to bias the envelope detector based receiver 400.

The RC filter 506 introduces a delay when outputting high-to-low voltages and low-to-high voltages and, thus, slows down the envelope detector based receiver 400. This delay of the RC filter 506 contributes to pulse width distortion of the AC input signal 401. The delay introduced by the RC filter 506 is greater than the delay introduced by the parasitic capacitance of the second capacitor 116 of FIG. 1A because the third capacitor 510 is larger than the second capacitor 116. The third capacitor 510 is larger than the second capacitor 116 because the third capacitor 510 needs to be larger to be able to remove noise from the full-wave signal to have a smooth output pulse signal 407. The receiver 100 includes a smaller output capacitor (e.g., the second capacitor 116) than the third capacitor 510 of the envelope detector based receiver 400 because noise is filtered out by the delay generator 120 of FIG. 1A, thus making the need for an RC filter moot.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus and articles of manufacture described herein improve an operation of ASK receivers by replacing an envelope detector with matched current mirror circuitry having a programmable voltage offset source that dictates the level of sensitivity and detectability of the receiver. The example ASK receiver disclosed herein consumes a significantly low amount of current relative to an envelope detector based receiver due to the matched current mirror implementation. The example ASK receiver disclosed herein includes pulse deglitchers that improve the output of the receiver by removing noise at a comparator output without effecting pulse width distortion of an input signal.

Example methods, apparatus, systems, and articles of manufacture to demodulate an input signal in a receiver are disclosed herein. Further examples and combinations thereof include the following:

Example 1 includes a receiver (100) operable to receive a modulated input signal (101) at a receiver input and output a demodulated signal (103) at a receiver output, the receiver (100) comprising a switch (104) having a first current terminal and a first control terminal, the first current terminal coupled to the receiver output, a capacitor (110) having a first terminal and a second terminal, the second terminal coupled to the first control terminal and the first terminal coupled to the receiver input, a resistor (112) having a third terminal and a fourth terminal, the fourth terminal coupled to the first control terminal, a voltage offset source (114) having an input and an output, the output coupled to the third terminal, and a current source (108) coupled to the first current terminal.

Example 2 includes the receiver (100) of example 1, further comprising a comparator (118) having an input terminal, the input terminal coupled to the first current terminal.

Example 3 includes the receiver (100) of example 1, wherein the switch (104) is a first switch, the current source (108) is a first current source, the receiver (100) further comprises a second switch (102) having a second current terminal and a second control terminal, the second current terminal coupled to the second control terminal and the input of the voltage offset source (114), and a second current source (106) coupled to the second current terminal.

Example 4 includes the receiver (100) of example 3, wherein the first switch (104) and the second switch (102) are matched switches and form a matched current mirror.

Example 5 includes the receiver (100) of example 1, wherein the input is a first input and the output is a first output, the receiver (100) further comprises a comparator (118) having a second input and a second output (109), the second input coupled to the first current terminal and the receiver output, and a delay generator (120) having a third input and a third output, the third input coupled to the second output (109).

Example 6 includes the receiver (100) of example 5, wherein the comparator (118) comprises a Schmitt trigger.

Example 7 includes the receiver (100) of example 5, wherein the delay generator (120) comprises pulse deglitchers.

Example 8 includes the receiver (100) of example 1, wherein the resistor (112) is a first resistor, the current source (108) is a first current source, the input is a first input, and the output is a first output, the voltage offset source (114) further includes an amplifier (122) having a second input, a third input, and a second output, the third input coupled to the second output, a second resistor (124) having a fifth terminal and a sixth terminal, the fifth terminal coupled to the second output and the sixth terminal coupled to the third terminal of the first resistor (112), and a second current source (126) coupled to the third terminal and the sixth terminal.

Example 9 includes the receiver (100) of example 8, wherein the amplifier (122) comprises a unity gain buffer and the second current source (126) comprises a trimming threshold current reference.

Example 10 includes the receiver (100) of example 1, wherein the switch (104) is a first switch, the current source (108) is a first current source, the input is a first input, and the output is a first output, the receiver (100) further comprises a second switch (102) having a second current terminal and a second control terminal, the second current terminal coupled to the second control terminal and the first input of the voltage offset source (114), a second current source (106) coupled to the second current terminal, a comparator (118) having a second input and a second output (109), the second input coupled to the first current terminal and the first current source (108), and a delay generator (120) having a third input coupled to the second output (109).

Example 11 includes the receiver (100) of example 1, wherein the switch (104) is a first switch, the current source (108) is a first current source, the resistor (112) is a first resistor, the input is a first input, and the output is a first output, the receiver (100) further comprises a second switch (102) having a second current terminal and a second control terminal, the second current terminal coupled to the second control terminal, a second current source (106) coupled to the second current terminal, an amplifier (122) having a second input, a third input, and a second output, the second input coupled to the second control terminal and the third input coupled to the second output, a second resistor (124) having a fifth terminal and a sixth terminal, the fifth terminal coupled to the second output and the sixth terminal coupled to the third terminal, a third current source (126) coupled to the third terminal and the sixth terminal, a comparator (118) having a fourth input and a fifth output (109), the fourth input coupled to the first current terminal and the first current source (108), and a delay generator (120) having a fifth input coupled to the fifth output (109).

Example 12 includes a receiver (100) operable to receive an amplitude modulated input signal (101) at a receiver input and output a demodulated signal (103) at a receiver output, the receiver (100) comprising, a switch (104) having a first current terminal and a first control terminal, the first current terminal coupled to the receiver output and the first control terminal coupled to the receiver input, a voltage offset source (114) having an input and an output, the output coupled to the first control terminal, a current source (108) coupled to the first current terminal, a capacitor (116) coupled to the first current terminal, wherein the switch (104) is turned off responsive to the amplitude modulated input signal (101) being less than a threshold voltage and the switch (104) is turned on responsive to the amplitude modulated input signal (101) being greater than the threshold voltage.

Example 13 includes the receiver (100) of example 12, wherein the receiver (100) comprises a second capacitor (116) having a first terminal and a second terminal, the first terminal is coupled to the receiver input and the second terminal is coupled to the first control terminal, and a resistor (112) having a third terminal and a fourth terminal, the fourth terminal coupled to the first control terminal.

Example 14 includes the receiver (100) of example 12, wherein the receiver (100) is implemented in a communication system, the communication system comprises processor circuitry (140) coupled to the receiver output and operable to receive the demodulated signal (103).

Example 15 includes the receiver (100) of example 12, wherein the receiver (100) comprises a comparator (118) coupled to the first current terminal, and a delay generator (120) coupled to the comparator (118) and operable to delay the output of the demodulated signal (103) responsive to the amplitude modulated input signal (101) being greater than the threshold voltage.

Example 16 includes the receiver (100) of example 12, wherein current source (108) is a first current source (108) and the voltage offset source (114) comprises an amplifier (122) having an inverting input, a non-inverting input, and an amplifier output, the amplifier output coupled to the inverting input, a resistor (124) coupled to the amplifier output and operable to set the threshold voltage, and a second current source (126) coupled to the resistor and the control terminal.

Example 17 includes the receiver (100) of example 12, wherein the switch (104) is a first switch (104) and the current source (108) is a first current source (108), the receiver (100) comprises a second switch (102) having a second current terminal and a second control terminal, the second control terminal coupled to the second current terminal and to the input of the voltage offset source (114), a second current source (106) coupled to the second current terminal, and wherein the second switch (102) and the second current source (106) form a current mirror with the first switch (104) and the first current source (108).

Example 18 includes a method operating a receiver (100) for demodulating an amplitude modulated input signal (101), the method comprising generating an offset voltage (ΔV) at a control terminal of a switch (104) utilizing a programmable threshold resistor (124), the offset voltage (ΔV) determined based on a sensitivity of the receiver (100), initiating the switch (104) responsive to an input signal (101) having an amplitude equal to or exceeding a threshold voltage of the switch (104), the threshold voltage based on the offset voltage (ΔV), transitioning an output of a comparator (118) from high voltage to low voltage responsive to the initiation of the switch (104), and delaying the output of the comparator (118) at an output (103) of the receiver (100) responsive to the transition from high voltage to low voltage.

Example 19 includes the method of example 18, further including deactivating the switch (104) responsive to the amplitude not satisfying the threshold voltage, transitioning the output of the comparator (118) from low voltage to high voltage responsive to the deactivation of the switch (104), and delaying the output of the comparator (118) at the output (103) of the receiver (100) responsive to the transition from low voltage to high voltage.

Example 20 includes the method of example 18, further including biasing the switch (104) with an amount of current that satisfies a power budget of the receiver (100).

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described embodiments, and other embodiments are possible, within the scope of the claims.

What is claimed is:

1. A receiver operable to receive a modulated input signal at a receiver input and output a demodulated signal at a receiver output, the receiver comprising:
   a switch having a first current terminal and a first control terminal, the first current terminal coupled to the receiver output;
   a capacitor having a first terminal and a second terminal, the second terminal coupled to the first control terminal and the first terminal coupled to the receiver input;
   a resistor having a third terminal and a fourth terminal, the fourth terminal coupled to the first control terminal;
   a voltage offset source having an input and an output, the output coupled to the third terminal; and
   a current source coupled to the first current terminal.

2. The receiver of claim 1, further comprising a comparator having an input terminal, the input terminal coupled to the first current terminal.

3. The receiver of claim 1, wherein the switch is a first switch, the current source is a first current source, the receiver further comprises:
   a second switch having a second current terminal and a second control terminal, the second current terminal coupled to the second control terminal and the input of the voltage offset source; and a second current source coupled to the second current terminal.

4. The receiver of claim 3, wherein the first switch and the second switch are matched switches and form a matched current mirror.

5. The receiver of claim 1, wherein the input is a first input and the output is a first output, the receiver further comprises:
- a comparator having a second input and a second output, the second input coupled to the first current terminal and the receiver output; and
- a delay generator having a third input and a third output, the third input coupled to the second output.

6. The receiver of claim 5, wherein the comparator comprises a Schmitt trigger.

7. The receiver of claim 5, wherein the delay generator comprises pulse deglitchers.

8. The receiver of claim 1, wherein the resistor is a first resistor, the current source is a first current source, the input is a first input, and the output is a first output, the voltage offset source further includes:
- an amplifier having a second input, a third input, and a second output, the third input coupled to the second output;
- a second resistor having a fifth terminal and a sixth terminal, the fifth terminal coupled to the second output and the sixth terminal coupled to the third terminal of the first resistor; and
- a second current source coupled to the third terminal and the sixth terminal.

9. The receiver of claim 8, wherein the amplifier comprises a unity gain buffer and the second current source comprises a trimming threshold current reference.

10. The receiver of claim 1, wherein the switch is a first switch, the current source is a first current source, the input is a first input, and the output is a first output, the receiver further comprises:
- a second switch having a second current terminal and a second control terminal, the second current terminal coupled to the second control terminal and the first input of the voltage offset source;
- a second current source coupled to the second current terminal;
- a comparator having a second input and a second output, the second input coupled to the first current terminal and the first current source; and
- a delay generator having a third input coupled to the second output.

11. The receiver of claim 1, wherein the switch is a first switch, the current source is a first current source, the resistor is a first resistor, the input is a first input, and the output is a first output, the receiver further comprises:
- a second switch having a second current terminal and a second control terminal, the second current terminal coupled to the second control terminal;
- a second current source coupled to the second current terminal;
- an amplifier having a second input, a third input, and a second output, the second input coupled to the second control terminal and the third input coupled to the second output;
- a second resistor having a fifth terminal and a sixth terminal, the fifth terminal coupled to the second output and the sixth terminal coupled to the third terminal;
- a third current source coupled to the third terminal and the sixth terminal;
- a comparator having a fourth input and a fifth output, the fourth input coupled to the first current terminal and the first current source; and
- a delay generator having a fifth input coupled to the fifth output.

12. A receiver operable to receive an amplitude modulated input signal at a receiver input and output a demodulated signal at a receiver output, the receiver comprising:
- a switch having a first current terminal and a first control terminal, the first current terminal coupled to the receiver output and the first control terminal coupled to the receiver input;
- a voltage offset source having an input and an output, the output coupled to the first control terminal;
- a current source coupled to the first current terminal;
- a capacitor coupled to the first current terminal; and
- wherein the switch is turned off responsive to the amplitude modulated input signal being less than a threshold voltage and the switch is turned on responsive to the amplitude modulated input signal being greater than the threshold voltage.

13. The receiver of claim 12, wherein the receiver comprises:
- a second capacitor having a first terminal and a second terminal, the first terminal is coupled to the receiver input and the second terminal is coupled to the first control terminal; and
- a resistor having a third terminal and a fourth terminal, the fourth terminal coupled to the first control terminal.

14. The receiver of claim 12, wherein the receiver is implemented in a communication system, the communication system comprises:
- processor circuitry coupled to the receiver output and operable to receive the demodulated signal.

15. The receiver of claim 12, wherein the receiver comprises:
- a comparator coupled to the first current terminal; and
- a delay generator coupled to the comparator and operable to delay the output of the demodulated signal responsive to the amplitude modulated input signal being greater than the threshold voltage.

16. The receiver of claim 12, wherein the current source is a first current source and the voltage offset source comprises:
- an amplifier having an inverting input, a non-inverting input, and an amplifier output, the amplifier output coupled to the inverting input;
- a resistor coupled to the amplifier output and operable to set the threshold voltage; and
- a second current source coupled to the resistor and the first control terminal.

17. The receiver of claim 12, wherein the switch is a first switch and the current source is a first current source, the receiver comprises:
- a second switch having a second current terminal and a second control terminal, the second control terminal coupled to the second current terminal and to the input of the voltage offset source;
- a second current source coupled to the second current terminal; and
- wherein the second switch and the second current source form a current mirror with the first switch and the first current source.

18. A method operating a receiver for demodulating an amplitude modulated input signal, the method comprising:

generating an offset voltage at a control terminal of a switch utilizing a programmable threshold resistor, the offset voltage determined based on a sensitivity of the receiver;

initiating the switch responsive to an input signal having an amplitude equal to or exceeding a threshold voltage of the switch, the threshold voltage based on the offset voltage;

transitioning an output of a comparator from high voltage to low voltage responsive to the initiation of the switch; and delaying the output of the comparator at an output of the receiver responsive to the transition from high voltage to low voltage.

19. The method of claim 18, further including:

deactivating the switch responsive to the amplitude not satisfying the threshold voltage;

transitioning the output of the comparator from low voltage to high voltage responsive to the deactivation of the switch; and delaying the output of the comparator at the output of the receiver responsive to the transition from low voltage to high voltage.

20. The method of claim 18, further including biasing the switch with an amount of current that satisfies a power budget of the receiver.

* * * * *